United States Patent [19]
Soejima et al.

[11] Patent Number: 6,024,800
[45] Date of Patent: Feb. 15, 2000

[54] PLASMA PROCESSING APPARATUS

[75] Inventors: Yukio Soejima; Toshimi Katsura; Hideaki Miyazawa, all of Kunitachi, Japan

[73] Assignee: Plasma System Corp., Tokyo, Japan

[21] Appl. No.: 09/013,521

[22] Filed: Jan. 26, 1998

[30] Foreign Application Priority Data

Jan. 31, 1997 [JP] Japan .................................. 9-019488

[51] Int. Cl.$^7$ .............................. B25J 21/00; H01L 21/00
[52] U.S. Cl. ........................ 118/719; 156/345; 414/217; 414/222; 414/744.6; 414/739
[58] Field of Search .............................. 118/719, 723 E; 156/345; 414/217, 222, 744.6, 739

[56] References Cited

U.S. PATENT DOCUMENTS

| | | |
|---|---|---|
| 4,592,306 | 6/1986 | Gallego . |
| 4,816,638 | 3/1989 | Ukai et al. . |
| 5,021,138 | 6/1991 | Babu et al. . |
| 5,183,547 | 2/1993 | Ikeda ....................................... 414/217 |
| 5,397,432 | 3/1995 | Konno et al. . |
| 5,584,647 | 12/1996 | Uehara et al. ........................... 414/222 |
| 5,713,717 | 2/1998 | Cho ....................................... 414/744.5 |
| 5,759,334 | 6/1998 | Kojima et al. ........................... 156/345 |

FOREIGN PATENT DOCUMENTS 0188208  7/1986  European Pat. Off. .

*Primary Examiner*—Thi Dang
*Attorney, Agent, or Firm*—Dilworth & Barrese

[57] ABSTRACT

According to the present invention, a plasma processing apparatus for performing surface processing of a substrate by means of plasma discharge is provided comprising: a processing chambers 10R and 10L for performing surface processing of a substrate W; a load-lock chamber 11 which is arranged in between these processing chambers 10R and 10L; and transporting mechanisms which are capable of performing substrate transport between load-lock chamber 11 and processing chamber 10R, and between load-lock chamber 11 and processing chamber 10L; these transporting mechanisms are freely movable in a reciprocating manner in the direction in which processing chamber 10R, load-lock chamber 11, and processing chamber 10L are contiguously arranged; wherein, upper wing 20U and lower wing 20L, which are spaced apart in a vertical manner with respect to each other, are provided as the aforementioned transporting mechanisms.

7 Claims, 11 Drawing Sheets

Fig. 8
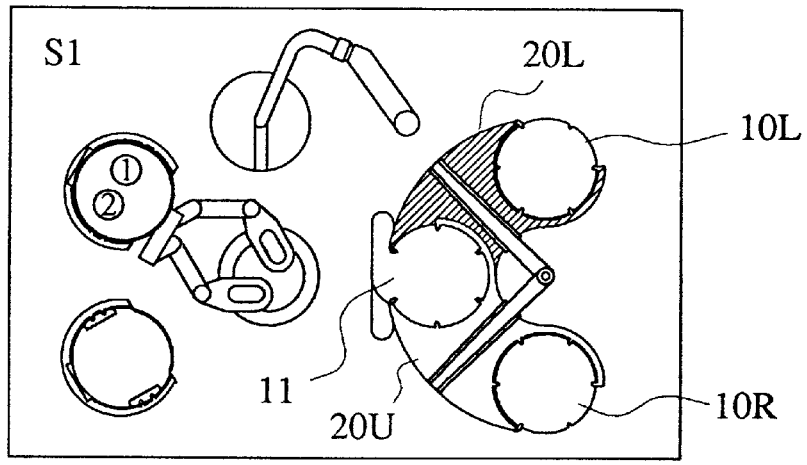
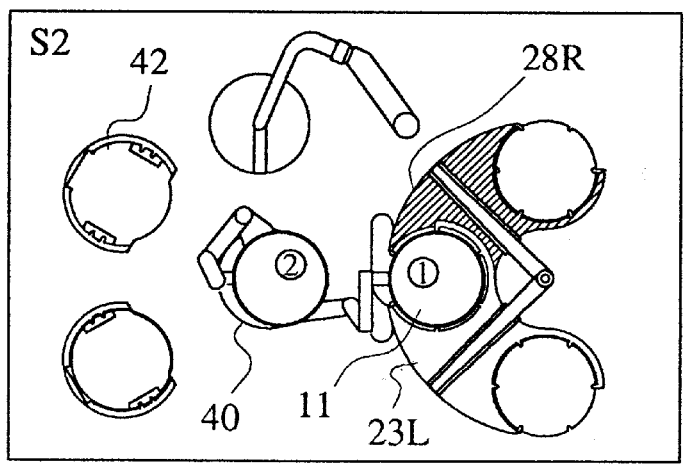
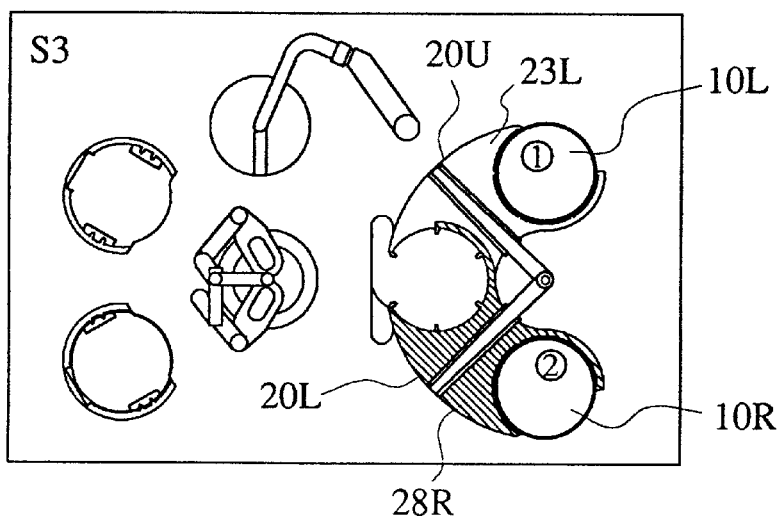

Fig. 9
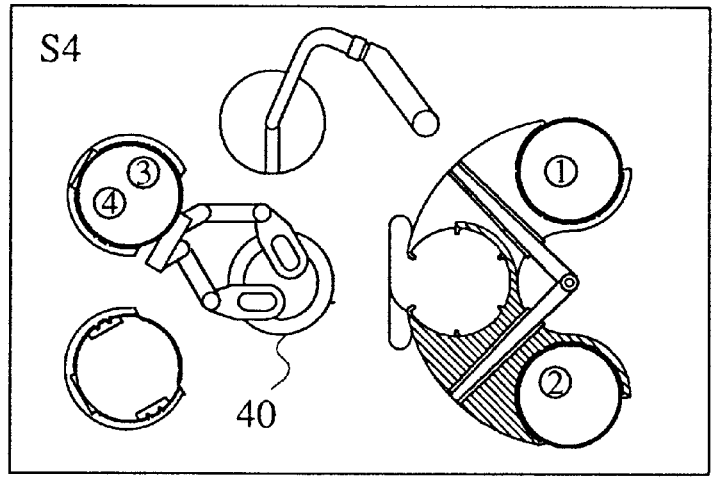
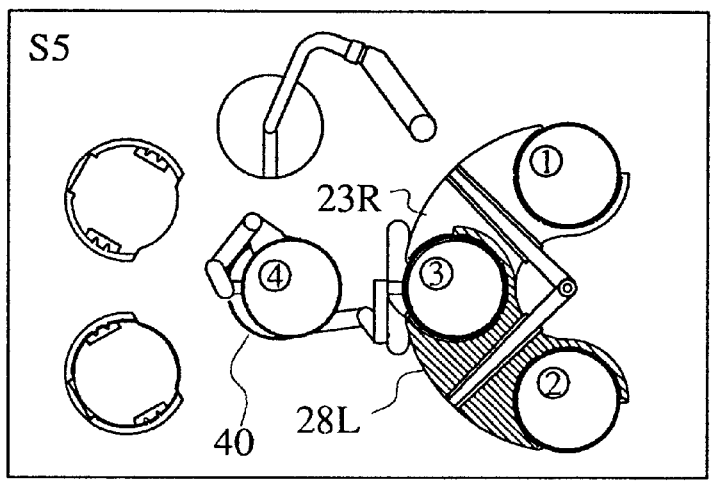
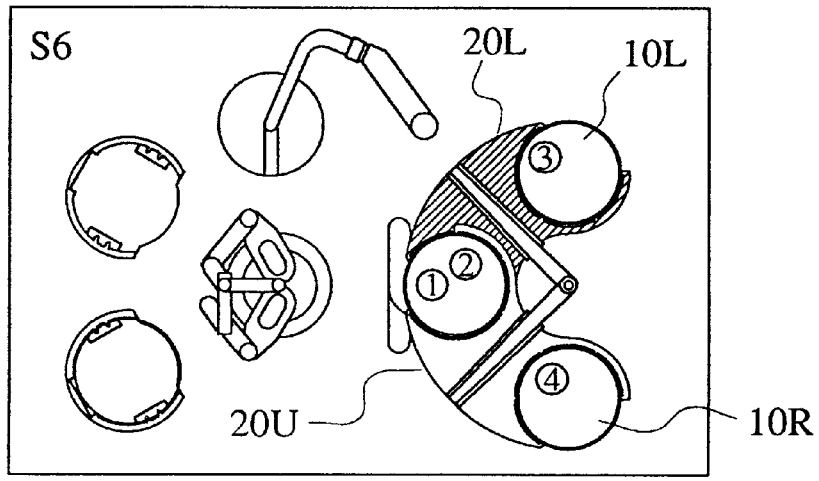

Fig. 10
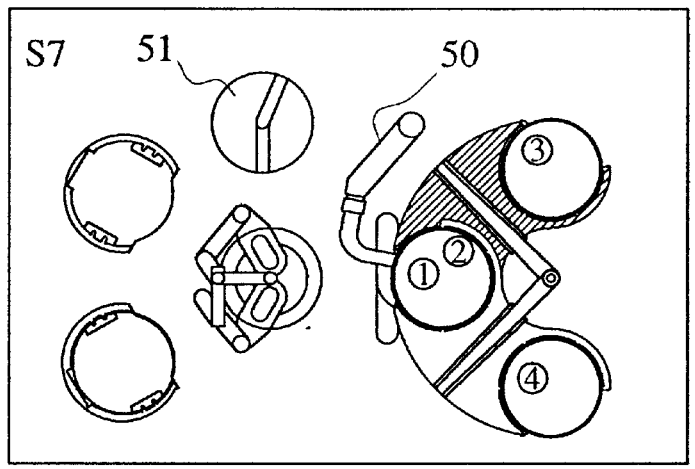
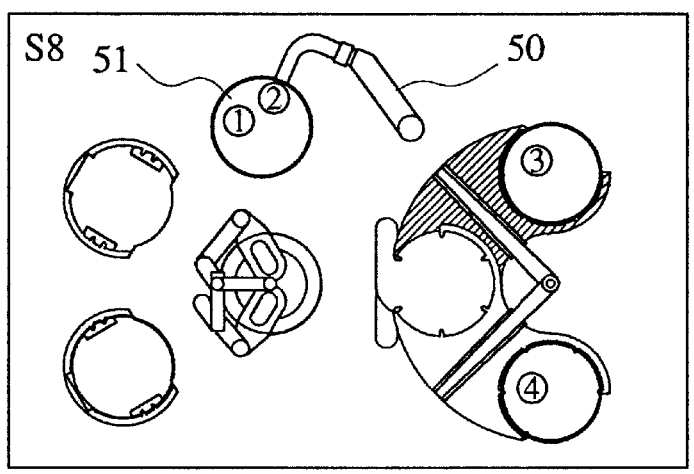
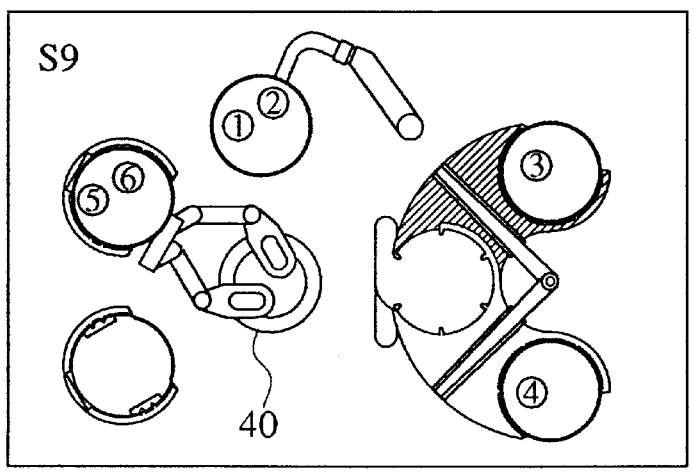

Fig. 11
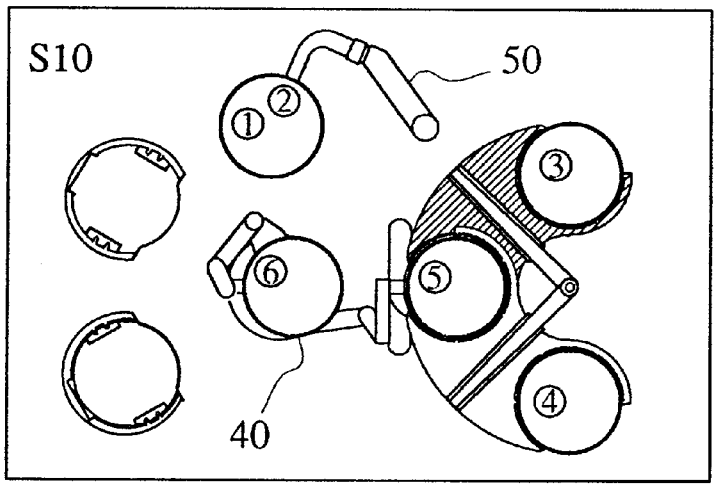
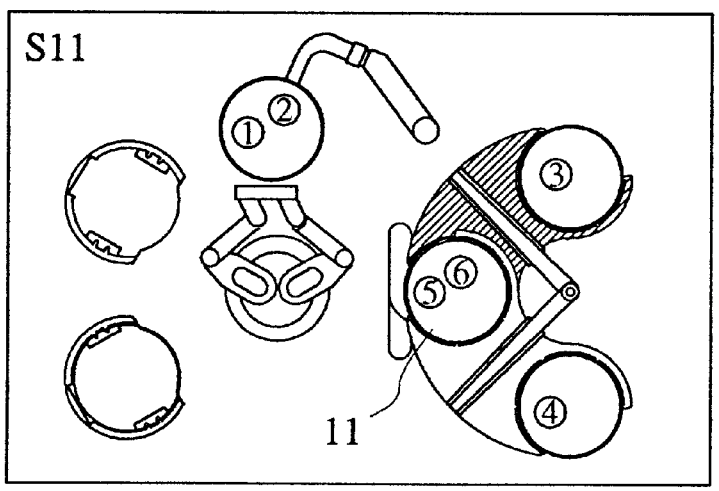
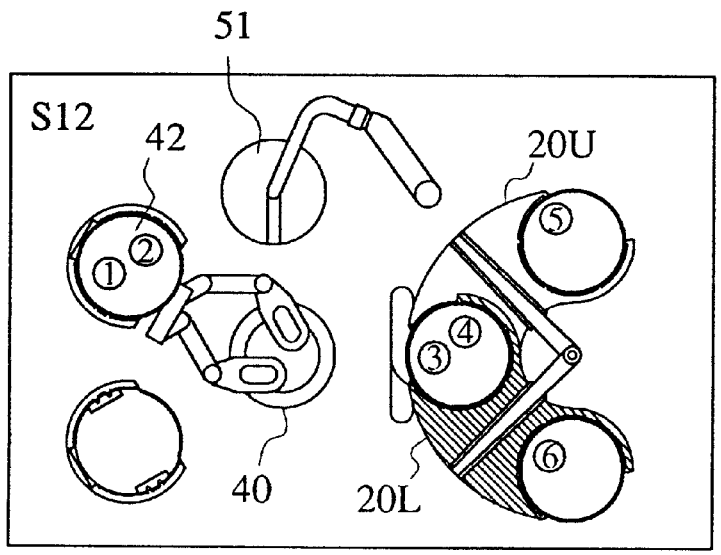

PLASMA PROCESSING APPARATUS

BACKGROUND OF THE INVENTION

1. Technical Field of the Invention

The present invention relates to a plasma processing apparatus for performing various surface processing such as etching, ashing, deposition, surface reforming and surface cleaning of semiconductor substrates, display substrates, multi-chip modules (MCM), printed circuit boards, and the like by means of applying plasma discharge.

2. Background Art

With regard to etching, ashing, deposition, surface reforming and surface cleaning of semiconductor substrates and the like according to conventional LSI manufacturing processes, various types of plasma processing apparatuses are being widely used which process substrates by generating plasma under a reduced pressure environment.

In these types of plasma processing apparatuses, a load-lock chamber is provided adjacent to the processing chamber in which the plasma processing is performed, and the substrates are transported through this load-lock chamber. In this case, an opening is provided between the processing chamber and the load-lock chamber for transporting substrates. During processing, this opening is hermetically sealed by a gate element, referred to as a "gate valve", and during transport, substrates are moved in and out of this opening.

However, with conventional plasma processing apparatuses, one load-lock chamber is normally provided for each processing chamber. As a result, problems arise in that the number of substrates that are processed per unit time, i.e., the throughput, is small. Consequently, a plasma processing apparatus with a large throughput is highly desirable.

SUMMARY OF THE INVENTION

In consideration of the aforementioned points, it is an object of the present invention to provide a plasma processing apparatus wherein an increased throughput is obtained.

According to the present invention, a plasma processing apparatus is provided for performing surface processing of a substrate by means of plasma discharge, said plasma processing apparatus comprising:

a first processing chamber and second processing chamber for performing surface processing;

a load-lock chamber positioned in between said first processing chamber and second processing chamber which connects to each of said first processing chamber and second processing chamber by means of a first connecting member and second connecting member, respectively;

a plurality of openings provided respectively in said first connecting member and second connecting member which allow communication between said first processing chamber and said load-lock chamber, and between said second processing chamber and said load-lock chamber, respectively; and transporting means which is capable of performing substrate transport between said load-lock chamber and said first processing chamber, and between said load-lock chamber and said second processing chamber by freely moving in a reciprocating manner through said openings in the direction in which said first processing chamber, said load-lock chamber, and said second processing chamber are contiguously arranged;

wherein, a plurality of said transporting means are provided in a vertical manner with respect each other.

According to an aspect of the present invention, said first processing chamber, said load-lock chamber, and said second processing chamber are contiguously arranged to form a circular arc, and said plurality of transporting means are freely movable in a reciprocating manner, by means of being rotated in said contiguous direction of arrangement.

According to another aspect of the present invention, a plasma processing apparatus is provided wherein in each of said first connecting member and second connecting member, an upper opening and a lower opening are respectively provided as said openings, said upper and lower openings being spaced apart in a vertical manner with respect to each other; an upper transporting means and a lower transporting means are provided as said transporting means at respective levels with said upper opening and lower opening; and said upper transporting means and lower transporting means each comprises, within said load-lock chamber, a gate valve for alternatively opening and closing said openings of said first connecting member and said openings of said second connecting member from said load-lock chamber side by means of being driven in a reciprocating manner in said contiguous direction of arrangement; a first holder for substrate support which is fixed on said first processing chamber side with respect to said gate bar, and is positioned within said first processing chamber at the time when said gate bar shuts said opening of said first connecting member; and a second holder for substrate support which is fixed on said second processing chamber side with respect to said gate bar, and is positioned within said second processing chamber at the time when said gate bar shuts said opening of said second connecting member.

In this case, preferably, in each of said first connecting member and said second connecting member, an intermediate gate valve for alternatively opening and closing said upper opening and said lower opening by means of being rotated, is respectively provided on said load-lock chamber side, in between said upper opening and said lower opening; and each of said openings is shut by means of one of said gate bar and said intermediate gate valve of said transporting means.

In addition, the plasma processing apparatus according to the present invention, preferably further comprises:

a substrate import robot for transporting a substrate from a substrate supply station to said load-lock chamber; and a substrate export robot, which is provided separately from said substrate import robot, for transporting a substrate from said load-lock chamber.

BRIEF EXPLANATION OF THE DRAWINGS

FIGS. 8–11 are explanatory diagrams showing a method for using the plasma processing apparatus shown in FIG. 1.

PREFERRED EMBODIMENTS OF THE INVENTION

In the following, the preferred embodiments of the present invention will be explained with reference to the figures. However, the present invention is not limited to these preferred embodiments.

Figure 1:
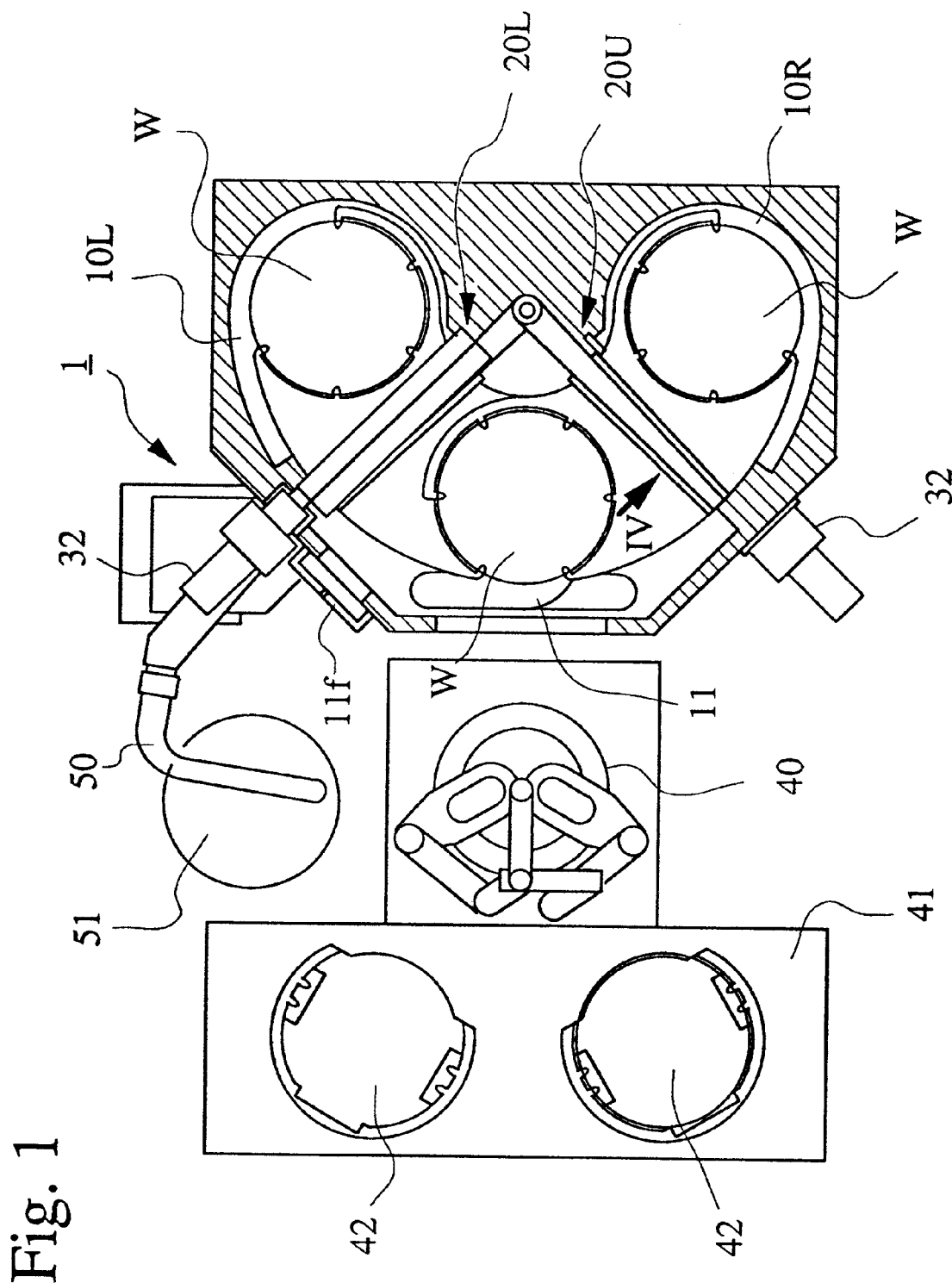
FIG. 1 is a plane diagram, including a partial cross-sectional view, showing a structural outline of a plasma processing apparatus according to a preferred embodiment of the present invention.

FIG. 1 is a plane diagram showing a structural outline of a plasma processing apparatus according to a preferred embodiment of the present invention. In the figure, plasma processing apparatus 1 comprises a processing chamber 10R (first processing chamber), processing chamber 10L (second processing chamber), load-lock chamber II, upper wing 20U, lower wing 20L, intermediate gate valve 30, substrate transport robot 40 (substrate import robot), and removal arm 50 (substrate export robot).

The processing chambers 10R and 10L are chambers that are respectively equipped with a plasma generating member, high vacuum exhaust member and the like. Within these processing chambers 10R and 10L, surface processing such as etching, ashing, deposition, surface reforming and surface cleaning of semiconductor substrates (e.g., silicon wafers), display substrates, multi-chip modules (MCM), printed circuit boards, and the like is performed by means of applying plasma discharge from a plasma generating member (not shown in the figure).

Load-lock chamber 11 is provided in between processing chambers 10R, 10L and cassette station 41 (substrate supply station), and contributes to the import/export of substrate W. In the embodiment shown in the aforementioned figure, this load-lock chamber 11 is situated in between the processing chambers 10R and 10L. According to the example shown in this figure, processing chamber 10R, load-lock chamber 11, and processing chamber 10L are contiguously arranged in the aforementioned order to form a circular arc.

Figure 4:
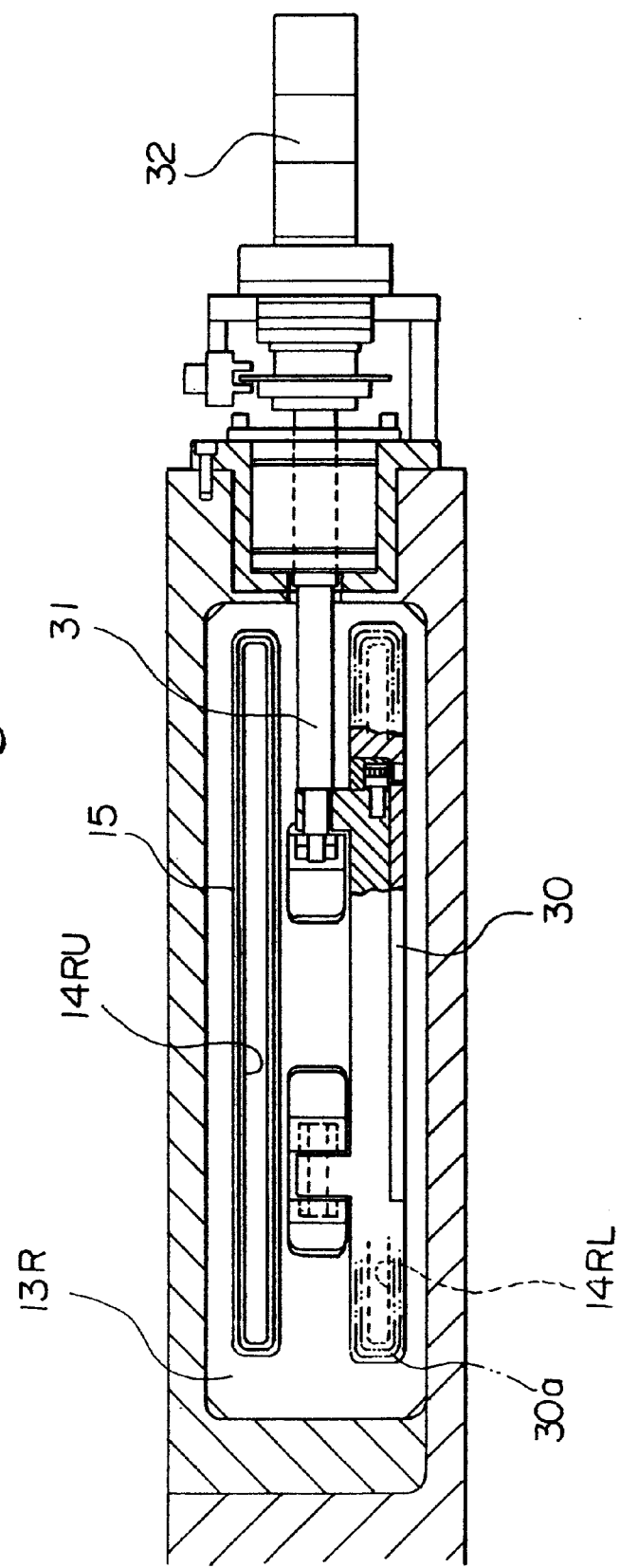
FIG. 4 is a side cross-sectional diagram FIG. 1 seen from the IV direction in FIG. 1.

Load-lock chamber 11 communicates with processing chamber 10R via gate plate 13R (shown in FIG. 4). In this gate plate 13R, an upper opening 14RU and a lower opening 14RL are respectively formed parallel to each other, extending in the horizontal plane, which allow communication between processing chamber 10R and load-lock chamber 11. Load-lock chamber 11 communicates also with processing chamber 10L via a similar gate plate in which an upper opening and a lower opening are respectively formed in parallel to each other, extending in the horizontal plane (not shown in the figure).

Figure 2:
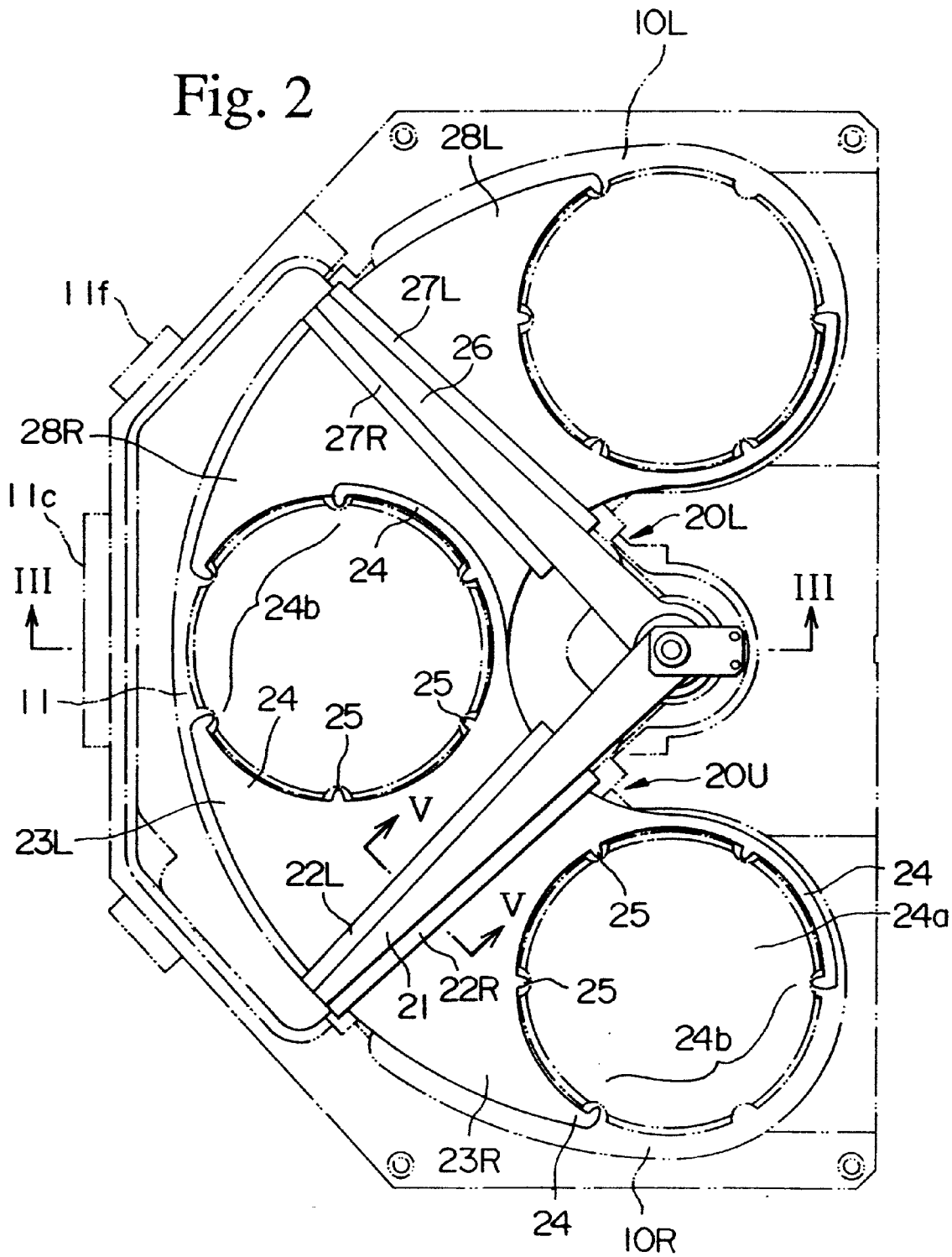
FIG. 2 is a plane diagram showing an enlargement of a substrate transportation system in the plasma processing apparatus shown in FIG. 1.
Figure 3:
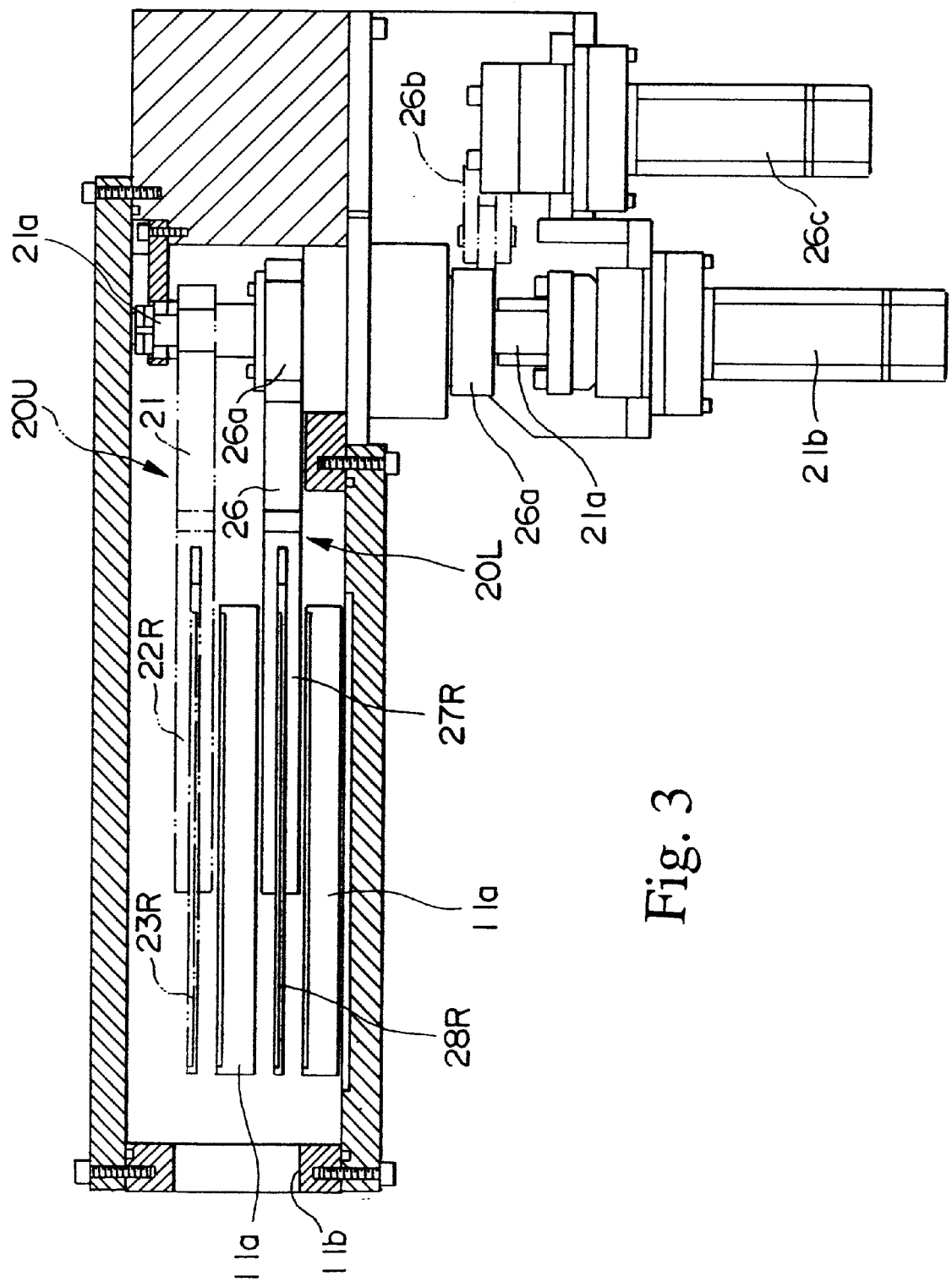
FIG. 3 is a side cross-sectional diagram showing the substrate transportation system of FIG. 2, along the line III—III of FIG. 2.

Upper wing 20U and lower wing 20L are spaced apart and aligned vertically with respect to each other, as shown in FIGS. 2 and 3. Upper wing 20U is formed from gate bar 21, contact members 22R and 22L, substrate holder 23R (first holder) and substrate holder 23L (second holder). Gate bar 21 is supported in a rotatable manner by means of motor 21 via central axle 21a. In this manner, gate bar 21 oscillates (driven back-and-forth) about a vertical axis within load-lock chamber 11 in the contiguous direction in which processing chamber 10R, load-lock chamber 11 and processing chamber 10L are arranged.

Contact member 22R is installed in the processing chamber 10R side of gate bar 21, and is designed such that the upper opening 14RU (FIG. 4) of gate plate 13R can be hermetically sealed shut from the load-lock chamber 11 side at the time when gate bar 21 rotates towards the side of processing chamber 10R. In order to ensure the aforementioned hermetic seal, a sealing member 15 (e.g., O-ring) is arranged around the periphery of opening 14RU.

Contact member 22L is installed in the processing chamber 10L side of gate bar 21, and is similarly designed to hermetically seal shut the gate plate opening (not shown in the figures) on the processing chamber 10L side at the time when gate bar 21 rotates towards the side of processing chamber 10L.

Substrate holder 23R is fixed to the processing chamber 10R side of contact member 22R such that it is positioned within processing chamber 10R at the time when gate bar 21 rotates to the processing chamber 10R side and contact member 22R seals upper opening 14RU.

In the same manner, substrate holder 23L is fixed to the processing chamber 10L side of contact member 22L such that it is positioned within processing chamber 10L at the time when gate bar 21 rotates to the processing chamber 10L side and contact member 22L seals the upper opening of the processing chamber 10L side gate plate (not shown in the figures).

These substrate holders 23R and 23L are fixed such that they maintain a horizontal state, and are constructed to match the height position of upper opening 14RU.

As shown in FIG. 2, substrate holders 23R and 23L respectively comprise a branch member 24 which extends to form a circular arc matched to the shape of, for example, a silicon wafer used as substrate W. In addition, substrate holders 23R and 23L also respectively possess a plurality of stop teeth 25.

In this manner, a hollow space 24a is created which is surrounded by means of branch member 24. In addition, by means of providing this hollow space 24a, the influence of the existence of substrate holders 23R and 23L can be suppressed to a minimum at the time of plasma processing.

Furthermore, branch member 25 is formed such that the tips thereof are separated by only a predetermined distance to form an access opening 24b. The import/export of substrate W within load-lock chamber 11 can hence be easily performed by means of these aforementioned hollow space 24a and access opening 24b.

In this manner, upper wing 20U can transport substrate W based on a construction comprising upper wing 20U, central axle 21a and motor 21b, as described in the aforementioned, between both load-lock chamber 11 and processing chamber 10R, and load-lock chamber 11 and processing chamber 10L.

These upper wing 20U, central axle 21a and motor 21b form an upper transporting means.

Lower wing 20L is similarly formed by means of gate bar 26, contact members 27R and 27L, substrate holder 28R (first holder) and substrate holder 28L (second holder). These structures, i.e., gate bar 26, contact members 27R and 27L, and substrate holders 28R and 28L are identical to the above-described structures, i.e., gate bar 21, contact members 22R and 22L, and substrate holders 23R and 23L, respectively, and thus their descriptions will be omitted.

Lower wing 20L differs from upper wing 20U with regard to the alignment height with lower opening 14RL (not upper opening 14RU), and also the driving method involved therein.

As shown in FIG. 3, lower wing 20L is driven by means of motor 26c via external axle 26a and transmitting member 26b. Lower wing 20L oscillates freely (moves freely in a reciprocating manner) about a vertical axis in a contiguous direction, in the same manner as upper wing 20U.

In this case, the central axle 21a and external axle 26a are designed to rotate independently from each other, such that upper wing 20U and lower wing 20L are able to rotate independently from and without interfering with each other.

It is possible to transport substrate W according to a construction comprising lower wing 20L, external axle 26a, transmitting member 26b and motor 26c, as described in the aforementioned, by placing lower wing 20L in between both load-lock chamber 11 and processing chamber 10R, and load-lock chamber 11 and processing chamber 10L. These lower wing 20L, external axle 26a, transmitting member 26b and motor 26c form a lower transporting means.

Here, hypothetically, if upper wing 20U and lower wing 20L are driven in opposite directions to each other (e.g., as shown in FIG. 2), under conditions in which upper wing 20U is positioned on the processing chamber 10R side while lower wing 20L is positioned on the processing chamber 10L side, with regard to gate plate 13R on the processing chamber 10R side, upper opening 14RU can be sealed shut by means of contact member 22R of upper wing 20U, however, it is not possible to seal shut lower opening 14RL by means of contact member 27R of lower wing 20L.

Figure 5:
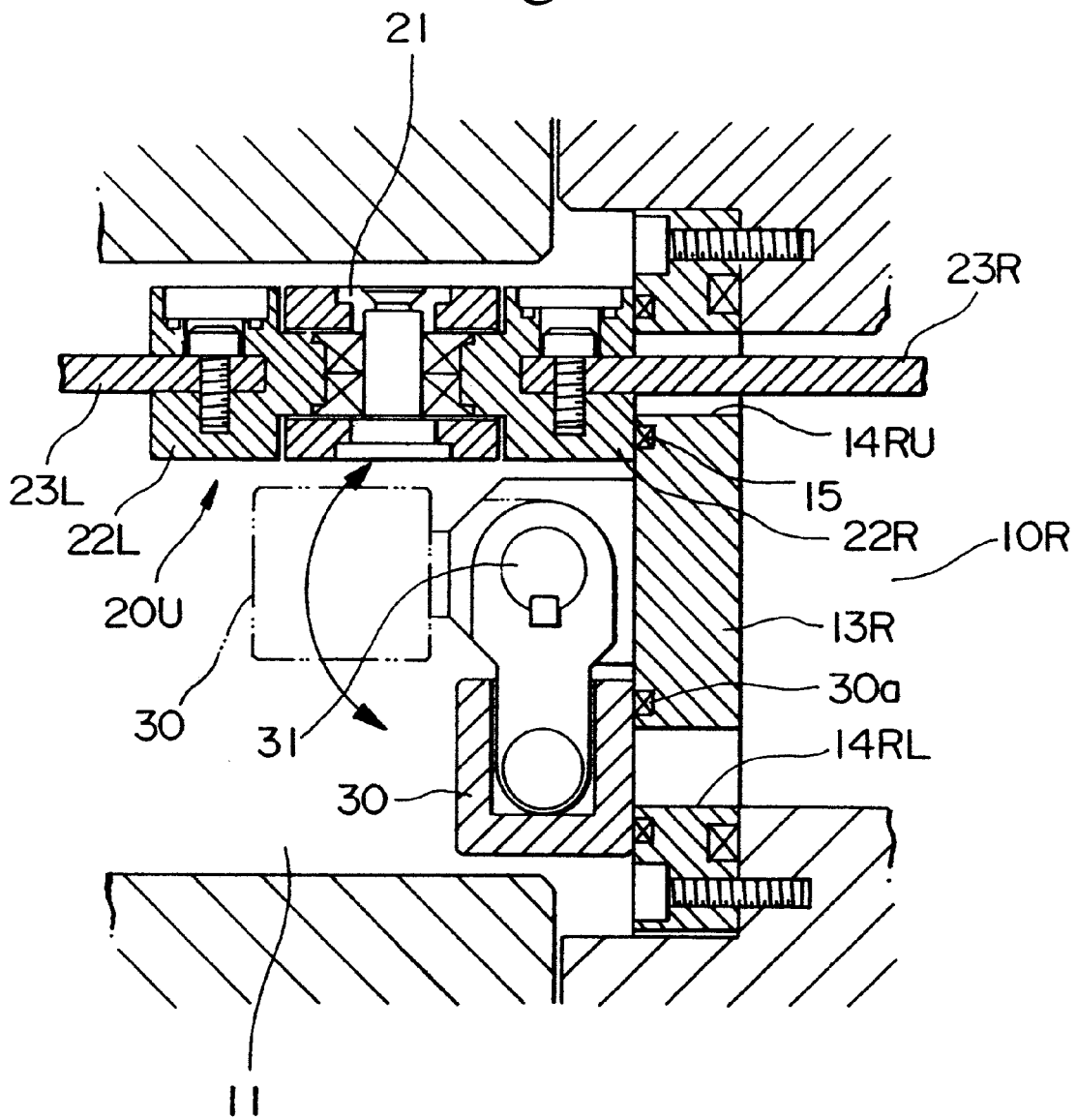
FIG. 5 is a side cross-sectional diagram showing an intermediate gate valve in the plasma processing apparatus shown in FIG. 1, along the line V—V of FIG. 2.

Thus, in this case, in order to seal shut lower opening 14RL, an intermediate gate valve 30 is provided. This intermediate gate valve 30 extends in the horizontal direction indefinitely as a contact member, as shown in FIGS. 4 and 5, and is provided on the load-lock chamber 11 side of gate plate 14.

Intermediate gate valve 30 is supported such that rotation by means of motor 32 via horizontal axle 31 is possible. In this figure, lower opening 14RL is hermetically sealed by intermediate gate valve 30 via a seal member 30a such as an O-ring or the like.

It is hence possible to selectively drive intermediate gate valve 30 to any of the following positions: (1) a position where lower opening 14RL is sealed shut; (2) an intermediate position between upper opening 14RU and lower opening 14RL, and (3) a position where upper opening 14RU is sealed shut.

In addition, within load-lock chamber 11, two heaters 11a for preheating the substrate are provided in the upper and lower parts of load-lock chamber 11, along with an access port 11b for allowing substrate import/export, as shown in FIG. 3.

Figure 6:
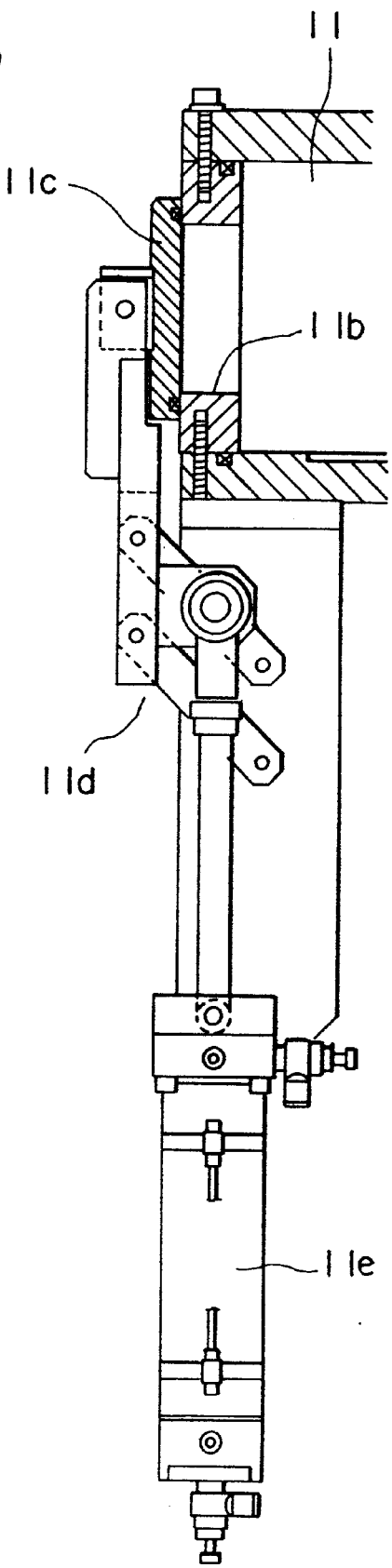
FIG. 6 is a side cross-sectional diagram showing an atmospheric gate valve (in the closed state) in the plasma processing apparatus shown in FIG. 1.
Figure 7:
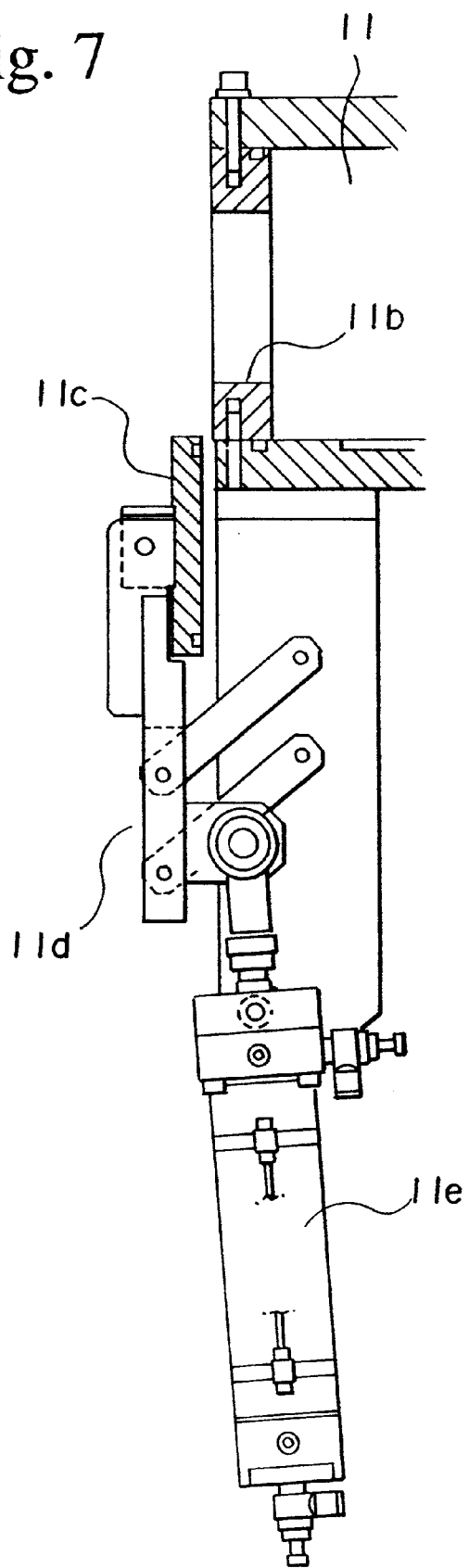
FIG. 7 is a diagram showing the same atmospheric gate valve of FIG. 6 in the open state.

In order to hermetically seal access port 11b shut, an atmospheric gate valve 11c is provided as shown in FIGS. 6 and 7. This atmospheric gate valve 11c is connected to a cylinder 11e via driving mechanism 11d. By means of cylinder 11e, atmospheric gate valve 11c can be driven between a state where access port 11b is hermetically sealed shut (FIG. 6) and a state where access port 11b is left open (FIG. 7).

Substrate transport robot 40 is, for example, a double arm-type substrate transport robot which is used for transporting a substrate W for importing from a cassette 42 arranged in a cassette station 41 to a load-lock chamber 11.

Removal arm 50 is used for exporting the substrate following processing (i.e., processed substrate) from the aforementioned load-lock chamber 11 to a cooling stage 51. Substrate transport robot 40 is used when returning the processed substrate from the cooling stage 51 to cassette 42.

In the following, a plasma processing apparatus 1 comprising the above construction will be described with reference to FIGS. 8~11.

To begin with, the initial state is as shown in S1 wherein upper wing 20U is positioned on the side of processing chamber 10R, while lower wing 20L is positioned on the side of processing chamber 10L. In this state, processing chambers 10R and 10L are maintained in a high vacuum, and load-lock chamber 11 is exposed (opened) to the atmosphere.

In this case, in order to maintain processing chamber 10R in a high vacuum, upper opening 14RU of gate plate 13R on the side of processing chamber 10R is shut by means of contact member 22R of upper wing 20U. In addition, lower opening 14RL is shut by means of intermediate gate valve 30.

With regard to the airtight (hermetic) maintenance of processing chamber 10L, the openings (not shown in the figures) are shut by means of similarly constructed intermediate gate valve (not shown in the figures) and contact member 27L of lower wing 20L.

In this state, as shown in S2, using substrate transport robot 40, substrate No. 1 and substrate No. 2 are transported in (imported) to the interior of load-lock chamber 11. At this time, for example, substrate No. 1 is supported by means of substrate holder 23L, while substrate No. 2 is supported by means of substrate holder 28R.

Upon completing substrate import, access port 11b is shut by means of atmospheric gate valve 11c, and load-lock chamber 11 is evacuated by means of a high vacuum exhaust member (not shown in the figures).

When the degree of vacuum of load-lock chamber 11 reaches a predetermined level, upper wing 20U is rotary driven towards processing chamber 10L, and substrate No. 1 supported by substrate holder 23L is transported into processing chamber 10L, as shown in S3. At the same time, lower wing 20L is rotary driven towards processing chamber 10R, and substrate No. 2 supported by substrate holder 28R is transported into processing chamber 10R.

When rotating upper wing 20U and lower wing 20L as described above, it is important that intermediate gate valve 30 be arranged in an intermediate position in order to avoid interfering with either wing.

Plasma processing of each substrate No. 1 and No. 2 is then conducted within the aforementioned processing chambers 10R and 10L. In this state, it goes without saying that each opening is hermetically sealed shut by means of the respective contact members and intermediate gate valves.

Substrate import into load-lock chamber 11 is conducted in parallel with the plasma processing of substrates No. 1 and No. 2.

In other words, an inactive gas is introduced into load-lock chamber 11 from, for example, a purge port 11f (shown in FIGS. 1 and 2) thereby creating a state in which load-lock chamber 11 can be opened to the atmosphere, following which atmospheric gate valve 11c is opened. Subsequently, as shown in S4–S5, substrates No. 3 and No. 4 are imported using the aforementioned substrate transport robot 40. In this case, substrate No. 3 is supported by means of substrate holder 28L, while substrate No. 4 is supported by means of substrate holder 23R. Upon completing substrate import, load-lock chamber 11 is evacuated.

After completion of both plasma processing of substrates No. 1 and No. 2 and evacuation of the load-lock chamber 11 to the predetermined vacuum level, upper wing 20U is rotated (rotary driven) towards processing chamber 10R, while lower wing 20L is simultaneously rotated towards processing chamber 10L, as shown in S6. As a result, the processed substrates No. 1 and No. 2 are exported to load-lock chamber 11, and substrates No. 3 and No. 4 to be processed are respectively transported into processing chamber 10L and processing chamber 10R.

Subsequently, substrates No. 3 and No. 4 undergo plasma processing within their respective processing chambers. Removal of substrates No. 1 and No. 2 is conducted in parallel to the aforementioned processing. In other words, after opening load-lock chamber 11 to the atmosphere, substrates No. 1 and No. 2 are exported to a cooling stage 51 using removal arm 50, as shown in S7~S8.

According to the present invention, the parallel execution of processed substrate removal by means of removal arm 50 (S7–S8), and substrate introduction by means of substrate transport robot 40 (S9) comprises one of the characteristic aspects of the present invention (note: this aforementioned operation is achieved by means of a construction wherein substrate transport robot 40 and removal arm 50 are provided independently). In this manner, substrate transport robot 40 can be placed in a standby state wherein the subsequent substrate(s) to be imported (e.g., substrates No. 5 and No. 6 in the figures) are supported by means of an arm thereof, i.e., in a state where importation can be quickly performed.

As a result, upon completion of the removal of the processed substrates (substrates No. 1 and No. 2) by means of removal arm 50, it is possible to immediately import the next substrate(s) (substrates No. 5 and No. 6) for transportation into load-lock chamber 11 (S10~S11).

Thereafter, as shown in S12, the processed substrates are returned from cooling stage 51 to cassette 42 using substrate transport robot 40.

The operations, i.e., rotation of upper wing 20U and lower wing 20L in opposite directions with respect to each other, removal of the processed substrate(s), etc. are performed as described in the aforementioned.

As described above, processing of substrate W can hence be performed while maintaining a large throughput.

According to the plasma processing apparatus of the present invention, the following effects are obtained.

According to the plasma processing apparatus of the present invention, a plurality of transporting means are able to conduct substrate transport from a load-lock chamber to both a first processing chamber and a second processing chamber. As a result, it is possible to transport a large number of substrates to these first and second processing chambers, and hence significantly increase the throughput thereof.

According to an embodiment of the present invention, a first processing chamber, load-lock chamber and second processing chamber are arranged in a contiguous manner to form a circular arc, wherein by rotating a plurality of transporting means, it is possible to move the aforementioned in the contiguous direction in a reciprocating manner. Consequently, the driving of the transporting means can be accomplished by means of a simple mechanism.

According to another embodiment of the present invention, each of the transporting means is equipped with a gate bar, and first and second holders, and thus in addition to substrate transport, each transporting means is capable of also shutting close an opening. As a result, it is possible to simplify the apparatus construction and achieve results such as minimizing the space occupied thereby, shortening the manufacturing time, reducing the manufacturing costs, reduction of maintenance labor and the like.

In the above case, in order to shut the appropriate openings, the apparatus construction can be even further simplified by means of providing an intermediate gate valve which is rotated to alternatively open/close an upper opening and lower opening.

In addition, when providing a substrate export robot as a separate structure from the substrate import robot, it is possible to achieve time to prepare the subsequent substrate import(s) using this period of time wherein substrate export is performed. In other words, it is possible to perform substrate exportation and substrate import preparation in parallel, and thus reduce the time required for substrate importation. Consequently, the throughput can be increased even more.

Furthermore, the plasma processing apparatus of the present invention is not limited to the aforementioned embodiments, and can be optionally revised and/or modified as long as these revisions and/or modifications fall within the scope of the claims of the present invention. For example, the following modifications of the embodiments are also possible.

(a) Instead of contiguously arranging processing chamber 10R, load-lock chamber 11 and processing chamber 10L to form a circular arc, these chambers can be arranged in an contiguous manner to form a straight line. In such a case, upper wing 20U and lower wing 20L are reciprocally driven in a straight line instead of rotated.

(b) The shape of the substrate holder and particularly the shape of the branch member are designed to fit the shape of the substrate.

(c) Instead of using substrate transport robot 40 (substrate import robot) for returning substrate W from cooling stage 51 to cassette 42, a robot specifically designed to perform substrate return can be provided separately.

(d) In place of a construction wherein load-lock chamber 11 is connected to processing chamber 10R (first processing chamber) via gate plate 13R (first connecting member), provided as a separate member, it is possible to provide any of the following: (1) a construction wherein gate plate 13R is integrated into processing chamber 10R; (2) a construction wherein gate plate 13R is integrated into load-lock chamber 11; or (3) a construction wherein gate plate 13R, processing chamber 10R and load-lock chamber 11 are integrated into a single unit.

The relationship can be achieved with respect to a second connecting member, second processing chamber and load-lock chamber, as well.

This application is based on patent application No. Hei 9-19488 filed in Japan, the content of which is incorporated herein by reference.

We claim:

1. A plasma processing apparatus for performing surface processing of a substrate by means of plasma discharge, said plasma processing apparatus comprising:

a first processing chamber and second processing chamber for performing surface processing;

a load-lock chamber positioned in between said first processing chamber and second processing chamber which connects to each of said first processing chamber and second processing chamber by means of a first connecting member and second connecting member, respectively;

a plurality of openings provided in said first connecting member and second connecting member which allow communication between said first processing chamber and said load-lock chamber, and between said second processing chamber and said load-lock chamber, respectively; and transporting means which is capable of performing substrate transport between said load-lock chamber and said first processing chamber, and between said load-lock chamber and said second processing chamber by freely moving in a reciprocating manner through said openings in the direction in which said first processing chamber, said load-lock chamber, and said second processing chamber are contiguously arranged;

wherein, a plurality of said transporting means are provided in a vertical manner with respect each other.

2. A plasma processing apparatus according to claim 1, wherein said first processing chamber, said load-lock chamber, and said second processing chamber are contiguously arranged to form a circular arc, and said plurality of transporting means are freely movable in a reciprocating manner, by means of being rotated, in said contiguous direction of arrangement.

3. A plasma processing apparatus according to claim 1, wherein in each of said first connecting member and second connecting member, an upper opening and a lower opening are respectively provided as said openings, said upper and lower openings being spaced apart in a vertical manner with respect to each other;

an upper transporting means and a lower transporting means are provided as said transporting means at respective levels with said upper opening and lower opening; and said upper transporting means and lower transporting means each comprises, within said load-lock chamber, a gate valve for alternatively opening and closing said opening of said first connecting member and said opening of said second connecting member from said load-lock chamber side by means of being driven in a reciprocating manner in said contiguous direction of arrangement; a first holder for substrate support which is fixed on said first processing chamber side with respect to said gate bar, and is positioned within said first processing chamber at the time when said gate bar shuts said opening of said first connecting member; and a second holder for substrate support which is fixed on said second processing chamber side with respect to said gate bar, and is positioned within said second processing chamber at the time when said gate bar shuts said opening of said second connecting member.

4. A plasma processing apparatus according to claim 2, wherein in each of said first connecting member and second connecting member, an upper opening and a lower opening are respectively provided as said openings, said upper and lower openings being spaced apart in a vertical manner with respect to each other;

an upper transporting means and a lower transporting means are provided as said transporting means at respective levels with said upper opening and lower opening; and said upper transporting means and lower transporting means each comprises, within said load-lock chamber, a gate valve for alternatively opening and closing said opening of said first connecting member and said opening of said second connecting member from said load-lock chamber side by means of being driven in a reciprocating manner in said contiguous direction of arrangement; a first holder for substrate support which is fixed on said first processing chamber side with respect to said gate bar, and is positioned within said first processing chamber at the time when said gate bar shuts said opening of said first connecting member; and a second holder for substrate support which is fixed on said second processing chamber side with respect to said gate bar, and is positioned within said second processing chamber at the time when said gate bar shuts said opening of said second connecting member.

5. A plasma processing apparatus according to claim 3, wherein in each of said first connecting member and said second connecting member, an intermediate gate valve for alternatively opening and closing said upper opening and said lower opening by means of being rotated, is respectively provided on said load-lock chamber side, in between said upper opening and said lower opening; and each of said openings is shut by means of either said gate bar or said intermediate gate valve of said transporting means.

6. A plasma processing apparatus according to claim 4, wherein in each of said first connecting member and said second connecting member, an intermediate gate valve for alternatively opening and closing said upper opening and said lower opening by means of being rotated, is respectively provided on said load-lock chamber side, in between said upper opening and said lower opening; and each of said openings is shut by means of either said gate bar or said intermediate gate valve of said transporting means.

7. A plasma processing apparatus according to claim 1, further comprising:

a substrate import robot for transporting a substrate from a substrate supply station to said load-lock chamber; and a substrate export robot, which is provided separately from said substrate import robot, for transporting a substrate from said load-lock chamber.

* * * * *